(12) United States Patent
Seno et al.

(10) Patent No.: US 7,606,094 B2
(45) Date of Patent: Oct. 20, 2009

(54) SEMICONDUCTOR MEMORY DEVICE AND CONTROL METHOD THEREOF

(75) Inventors: Masski Seno, Tokyo (JP); Akihiko Kagami, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 268 days.

(21) Appl. No.: 11/781,757

(22) Filed: Jul. 23, 2007

(65) Prior Publication Data

US 2008/0019201 A1    Jan. 24, 2008

(30) Foreign Application Priority Data

Jul. 24, 2006    (JP) .............................. 2006-201354
Jun. 7, 2007    (JP) .............................. 2007-152166

(51) Int. Cl.
*G11C 7/00* (2006.01)

(52) U.S. Cl. ...................................... 365/203; 365/207

(58) Field of Classification Search ................. 365/203, 365/207, 189.09
See application file for complete search history.

(56) References Cited

U.S. PATENT DOCUMENTS 5,949,729 A * 9/1999 Suyama et al. .............. 365/207
6,018,481 A * 1/2000 Shiratake .................... 365/190
6,144,599 A * 11/2000 Akita et al. ................. 365/203
6,343,038 B1 1/2002 Makino et al.
7,394,709 B2 * 7/2008 Mori et al. .................. 365/203

FOREIGN PATENT DOCUMENTS

| JP | 11-149793 A | 6/1999 |
|----|-------------|--------|
| JP | 2000-182374 A | 6/2000 |
| JP | 2001-75498 A | 3/2001 |
| JP | 2001-76498 A | 3/2001 |

* cited by examiner

*Primary Examiner*—Anh Phung
(74) *Attorney, Agent, or Firm*—Sughrue Mion, PLLC

(57) ABSTRACT

A semiconductor memory device of the invention has memory cells arranged at intersections of bit lines and word lines, and comprises a sense amplifier for amplifying a minute potential difference appearing on a bit line pair; a power supply line pair including first and second power supply lines for supplying first and second potentials to the sense amplifier; a pre-charge power supply line for supplying a predetermined pre-charge potential; a power supply line equalize circuit for setting the first and second potentials at the same potential based on the pre-charge potential; a current limit circuit inserted in series in a predetermined current path from the pre-charge power supply line to the power supply line pair; and switch means capable of switching whether or not current flowing from the pre-charge power supply line to the power supply line pair is limited by the current limit circuit based on a control signal.

18 Claims, 13 Drawing Sheets

SEMICONDUCTOR MEMORY DEVICE AND CONTROL METHOD THEREOF

BACKGROUND OF THE INVENTION

1. Field of the Invention

The present invention relates to a semiconductor memory device having a sense amplifier for amplifying data stored in a memory cell, and particularly relates to a semiconductor memory device configured to pre-charge a power supply line pair for supplying power to the sense amplifier.

2. Description of the Related Art

Generally, a DRAM as a semiconductor memory device has a configuration in which a large number of memory cells are arranged at intersections of a plurality of bit lines and a plurality of word lines. A cross failure due to a short circuit between a word line and a bit line is know as one of defects which cause trouble in manufacturing the DRAM. In order to cope with an increase in current due to the cross failure, the DRAM is generally configured to have redundant cells, and a defective cell corresponding to a word line and a bit line at which the cross failure exists is replaced with a redundant cell. Although operational trouble in the DRAM can be prevented by employing such measures, current leak due to the cross failure is a problem since specification for current in the DRAM for mobile use which requires low power consumption is strict. That is, a current leak path via a circuit portion including the cross failure in the DRAM remains regardless of the redundant cells, and therefore depending on the number of cross failures, products may become defective which does not satisfy the specification for current. Thus, an increase in the number of cross failures causes a decrease in manufacturing yield. In order to take measures against such a problem, a configuration in which a current limiter for limiting current flowing in a bit line equalize circuit is employed (refer to, e.g., Japanese Patent Application Publication No. H11-149793).

FIG. 12 is an example of the configuration of the conventional DRAM including the above-mentioned current limiter, in which an area including one word line WL and two pairs of the bit lines BL and bBL are shown. In FIG. 12, a circuit portion corresponding to a bit line pair BL(i) and bBL(i) where the cross failure does not exist, and a circuit portion corresponding to a bit line pair BL(j) and bBL(j) where the cross failure CF exist are compared. A sense amplifier SA connected to the respective bit line pair BL and bBL is provided to amplify a minute potential difference of each memory cell MC, and a power supply line SAP on the PMOS transistor side and a power supply line SAN on the NMOS transistor side are connected thereto. There are provided a bit line equalize circuit 301 for pre-charging/equalizing the bit line pair BL and bBL based on an equalize control line EQD of the bit line side, and a current limiter 302 inserted between a pre-charge power supply line VHVD and the bit line equalize circuit 301. Further, there are provided a sense amplifier drive circuit 303 for driving the sense amplifier SA, and a power supply line equalize circuit 304 for pre-charging/equalizing a power supply line pair SAP and SAN based on an equalize control line EQ of the power line side.

Operation of the DRAM of FIG. 12 in a self refresh period will be described with reference to a timing chart of FIG. 13. First, a pulse of a trigger signal TRG representing the start of the self refresh operation is output from a control logic unit (not shown). At this point, the equalize control lines EQ and EQD are maintained high, and the bit line pair BL and bBL and the power supply line pair SAP and SAN are pre-charged. Thereafter, the equalize control lines EQ and EQD change to low to finish the pre-charge, the word line WL rises to a selection level to start the self refresh operation, and large potentials appear on the bit line pair BL and bBL and the power supply line pair SAP and SAN. When the self refresh is finished, the word line WL falls and the equalize control lines EQ and EQD change to high. Thereby, the bit line pair BL and bBL and the power supply line pair SAP and SAN are pre-charged again. At this point, the level of the bit line pair BL(j) and bBL(j) where the cross failure CF exists gradually decreases to near the ground level due to discharge caused by current leak while keeping the same potential as each other. In this case, current flowing from the pre-charge power supply line VHVD through the bit line equalize circuit 301 is limited by the current limiter 302.

However, lower voltage is required for recent DRAMs for mobile use, a threshold voltage Vt of a PMOS transistor in the sense amplifier SA is decreased, a problem of current leak which is different from the conventional DRAM arises. That is, in the configuration of FIG. 12, there is a current leak path P from the pre-charge power supply line VHVD through the power supply line equalize circuit 304, the power supply line SAP, a pair of PMOS transistors of the sense amplifier SA, the bit line pair BL(j) and bBL(j), the bit line equalize circuit 301, the cross failure CF and the word line WL. This is because if a negative potential is supplied to the word line WL due to the lower voltage of the DRAM, the potential of the bit line BL(j) is decreased due to the cross failure CF, and thereby the PMOS transistors of the sense amplifier SA tend to be on. Accordingly, particularly in the self refresh period of the DRAM, the influence of the current leak flowing through the current leak path P including the power supply line pair SAP and SAN is inevitable. Even if the measures are taken by using the above-mentioned current limiter 302, since consumption current is remarkably increased due to the current leak path P, a problem arises in that an increase in consumption current and a decrease in manufacturing yield caused by an increase in cross failures CF cannot be suppressed.

BRIEF SUMMARY OF THE INVENTION

It is an object of the present invention to provide a semiconductor memory device, in which an increase in consumption current due to a cross failure between a word line and a bit line can be suppressed, and manufacturing yield of the semiconductor memory device can be improved.

An aspect of the present invention is a semiconductor memory device having a plurality of memory cells arranged at intersections of a plurality of bit lines and a plurality word lines, comprising: a sense amplifier for amplifying a minute potential difference appearing on a bit line pair corresponding to an accumulated charge in said memory cell; a power supply line pair including a first power supply line for supplying a first potential to said sense amplifier and a second power supply line for supplying a second potential to said sense amplifier; a pre-charge power supply line for supplying a predetermined pre-charge potential; a power supply line equalize circuit for setting said first potential and said second potential of said power supply line pair at the same potential based on said pre-charge potential; a current limit circuit inserted in series in a predetermined current path from said pre-charge power supply line to said power supply line pair; and switch means capable of switching whether or not current flowing from said pre-charge power supply line to said power supply line pair is limited by said current limit circuit, based on a control signal.

According to the semiconductor memory device of the present invention, in the current path passing the power supply line pair for driving the sense amplifier, it is possible to switch between a state in which current supplied from the pre-charge power supply line is limited by the current limit circuit and a state in which the current is not limited by the current limit circuit, under the control of the switch means. Thus, when the number of the cross failures of the bit lines and the word lines increases and a problem of leak current through the current path including the power supply line pair, an undesired increase in consumption current due to current leak can be suppressed by controlling so that current is appropriately limited by the current limit circuit in a time range when current for refresh or pre-charge is not required to flow. Particularly, by limiting current under the switch means in a pause state between every refresh operation in the self refresh period, the present invention has a large effect of reducing an average current in standby operation. Further, in the configuration of the present invention, only the current limit circuit and the switch means need to be added, the above-mentioned effect can be achieved with a small circuit scale.

In the present invention, said sense amplifier may include a pair of PMOS transistors and a pair of NMOS transistors, said first power supply line may supply said first potential to said pair of PMOS transistors, and said second power supply line may supply said first potential to said pair of NMOS transistors.

In the present invention, said power supply line equalize circuit may include a first MOS transistor connected between said pre-charge power supply line and said first power supply line, a second MOS transistor connected between said pre-charge power supply line and said second power supply line, and a third MOS transistor connected between said first power supply line and said second power supply line, and commonly connected gates of the MOS transistors may be connected to an equalize control line.

In the present invention, said first, second and third MOS transistors of said power supply line equalize circuit may be NMOS transistors.

In the present invention, said switch means may be connected to said current limit circuit in parallel and may include a MOS transistor whose conductive state is controlled based on said control signal applied to a gate thereof.

In the present invention, said MOS transistor of said switch means may be a NMOS transistor.

In the present invention, said current limit circuit may be connected between said pre-charge power supply line and said power supply line equalize circuit in series and may include a MOS transistor for limiting current in response to a gate voltage.

In the present invention, said MOS transistor of said current limit circuit may be a PMOS transistor In the present invention, said current limit circuit may include a third MOS transistor connected to said first MOS transistor in parallel and a fourth MOS transistor connected to said second MOS transistor in parallel, and may limit current in response to respective gate voltages.

In the present invention, said third and fourth MOS transistors of said current limit circuit may be PMOS transistors.

In the present invention, said power supply line equalize circuit may also function as said switch means by supplying said control signal to said equalize control line.

The present invention may further comprise a bit line equalize circuit for setting said bit line pair at the same potential based on said pre-charge potential and a current limit circuit for bit line pair for limiting current flowing from said pre-charge power supply line to said bit line pair through said bit line equalize circuit.

In the present invention, said power supply line equalize circuit may include a first MOS transistor connected between an output side of said current limit circuit and said first power supply line, a second MOS transistor connected between an input side of said current limit circuit and second power supply line and a third MOS transistor connected between said first power supply line and said second power supply line, and commonly connected gates of the first and second MOS transistors may be connected to a first equalize control line, while a gate of the third MOS transistor may be connected to a second equalize control line.

In the present invention, said first, second and third MOS transistors of said power supply line equalize circuit may be NMOS transistors.

An aspect of the present invention is a control method of the semiconductor memory device, comprising: controlling said switch means in a self refresh period during which self refresh is performed at a predetermined interval so that current flowing from said pre-charge power supply line to said power supply line pair is not limited by said current limit circuit and pre-charging said power supply line pair using said power supply line equalize circuit; performing self refresh for a selected word line using said sense amplifier after the pre-charge is finished; and controlling said switch means after the self refresh is finished so that current flowing from said pre-charge power supply line to said power supply line pair is limited by said current limit circuit.

According to the control method of the present invention, control for the purpose of reducing consumption current in the self refresh period of the semiconductor memory device can be realized. That is, the switch means controls the current limit circuit so that current is not limited in the pre-charge before the self refresh and in the self refresh, while current is controlled to be limited at a predetermined timing after the self refresh is finished, and this state can be maintained until the subsequent self refresh. Thereby, a period during which current is not limited by the current limit circuit, which depends on an interval of the self refresh, can be relatively short, and in most of the period, current can be suppressed. Therefore, even when leak current due to the cross failure is a problem, the average current in the self refresh period can be sufficiently reduced.

Further, an aspect of the present invention is a control method of the semiconductor memory device, comprising: controlling the MOS transistor of said switch means to be on based on said control signal in a self refresh period during which self refresh is performed at a predetermined interval so that current flowing from said pre-charge power supply line to said power supply line pair is limited by said current limit circuit and pre-charging said power supply line pair using said power supply line equalize circuit; performing self refresh for a selected word line using said sense amplifier after the pre-charge is finished; and controlling the MOS transistor of said switch means to be off based on said control signal after the self refresh is finished so that current flowing from said pre-charge power supply line to said power supply line pair is limited by said current limit circuit.

Further, an aspect of the present invention is a control method of the semiconductor memory device, comprising: controlling said equalize control line to be switched from on to off in a self refresh period during which self refresh is performed at a predetermined interval and pre-charging said power supply line pair using said power supply line equalize circuit; performing self refresh for a selected word line using said sense amplifier, in a state in which said equalize control line is switched from a non-conductive state to a conductive state at a timing when the pre-charge is finished; pre-charging said power supply line using said power supply line equalize circuit by changing said equalize control line after the self refresh is finished; and changing said equalize control line to an original state at a timing when the pre-charge is finished.

Further, an aspect of the present invention is a control method of the semiconductor memory device, comprising:

controlling said switch means in a self refresh period during which self refresh is performed at a predetermined interval so that current flowing from said pre-charge power supply line to said first power supply line is not limited by said current limit circuit and pre-charging said power supply line pair using said power supply line equalize circuit while keeping said first and second power supply lines at the same potential by said first equalize control line; stopping the pre-charge by said first equalize control line and performing self refresh for a selected word line using said sense amplifier, in a state in which said first and second power supply lines are disconnected; pre-charging said power supply line pair using said first equalize control line after the self refresh is finished while keeping said first and second power supply lines at the same potential by said second equalize control line; and controlling said switch means so that current flowing from said pre-charge power supply line to said first power supply line is limited by said current limit circuit, and controlling said second equalize control line so that said first and second power supply lines are disconnected;

As described above, according to the present invention, since the current limit circuit is provided in the current path including the power supply line pair for driving the sense amplifier and the switch means for controlling the current limit circuit is provided, it is possible to suppress an increase in current leak due to the cross failure with a simple circuit configuration even when the cross failure of the bit line and the word line exists. Particularly, in a time range in which operation current is not required to be supplied in the self refresh period, the switch means is controlled so that current is limited by the current limit circuit, and thereby the average current can be sufficiently reduced. Further, even when the number of cross failures increases, a decrease in manufacturing yield can be prevented.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

Embodiments of the present invention will be described below with reference to accompanying drawings. Herein, three embodiments having different configurations when applying the present invention to a DRAM as a semiconductor memory device will be described.

First Embodiment

Figure 1:
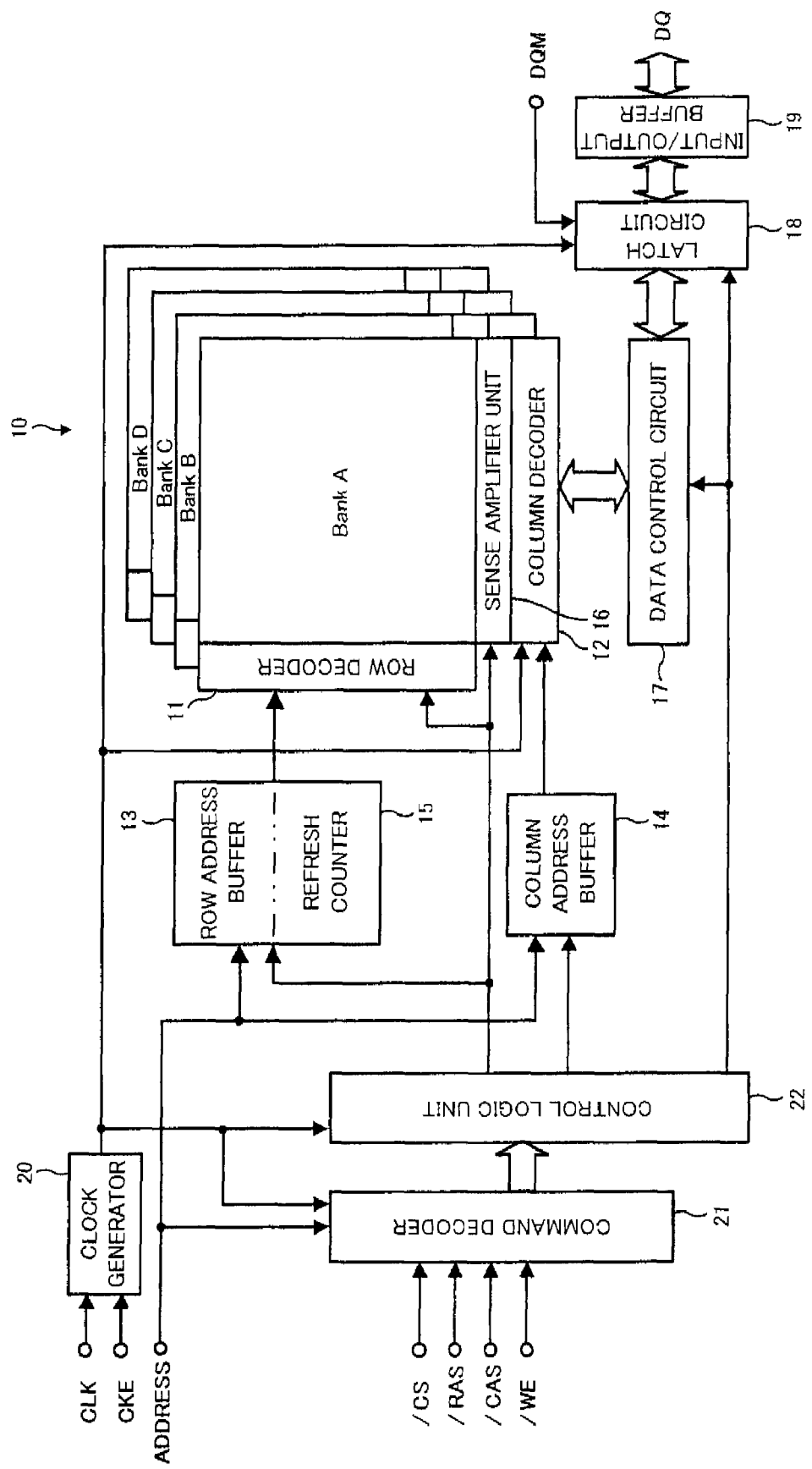
FIG. 1 is a block diagram showing an entire configuration of a DRAM of the first embodiment.

FIG. 1 is a block diagram showing an entire configuration of a DRAM of the first embodiment. The DRAM shown in FIG. 1 has a memory cell array 10 in which a large number of memory cells are arranged at intersections of a plurality of word lines and a plurality of bit lines in a matrix form. The memory cell array 10 is divided into a plurality of banks (four banks A, B, C and D are shown in the example of FIG. 1) each capable of being controlled individually. Respective banks have the same size and the same configuration. The DRAM shown in FIG. 1 has a row decoder 11, a column decoder 12, a row address buffer 13, a column address buffer 14, a refresh counter 15, a sense amplifier unit 16, a data control circuit 17, a latch circuit 18, an input/output buffer 19, a clock generator 20, a command decoder 21 and a control logic unit 22 in addition to the memory cell array 10.

In the above-mentioned configuration, when the memory cell array 10 is accessed, a word line corresponding to a row address is selected by the row decoder 11 and a bit line corresponding to a column address is selected by the column decoder 12. An address signal input from the outside includes the row address, which is stored in the row address buffer 13 and sent to the row decoder 11, and the column address, which is stored in the column address buffer 14 and sent to the column decoder 12. Meanwhile, when the memory cell array 10 is refreshed, the row address of a target word line is counted by the refresh counter 15 sequentially and sent to the row decoder 11.

The sense amplifier unit 16 includes a large number of sense amplifiers for reading and amplifying data stored in each memory cell through a bit line pair when reading data from the memory cell array 10. Data of the sense amplifier unit 16 is stored in the latch circuit 18 sequentially under the control of the data control circuit 17 and output to the outside as a DQ signal from the input/output buffer 19 in synchronization with a clock signal CLK, Further, the DQ SIGNAL from the outside is stored into the latch circuit 18 through the input/output buffer 19, and is written to each memory cell of the memory cell array 10 under the control of the data control circuit 17 when writhing data to the memory cell array 10.

The clock generator 20 generates an internal clock using the clock signal CLK and a clock enable signal CKE which are input from the outside, and supplies it to each portion of the DRAM. The command decoder 21 decodes a command input from the outside and sent it to the control logic unit 22.

In addition, various commands are defined corresponding to combination patterns of control signals (a row address strobe signal /RAS, a column address strobe signal /CAS and a write enable signal /WE) input to the command decoder 21. The control logic unit 22 controls operation of the DRAM entirely, and a predetermined control signal is supplied to each element of the DRAM. Operation states controlled by the control logic unit 22 include self refresh operation performed at a predetermined interval in standby mode as well as normal operation of the DRAM.

Figure 2:
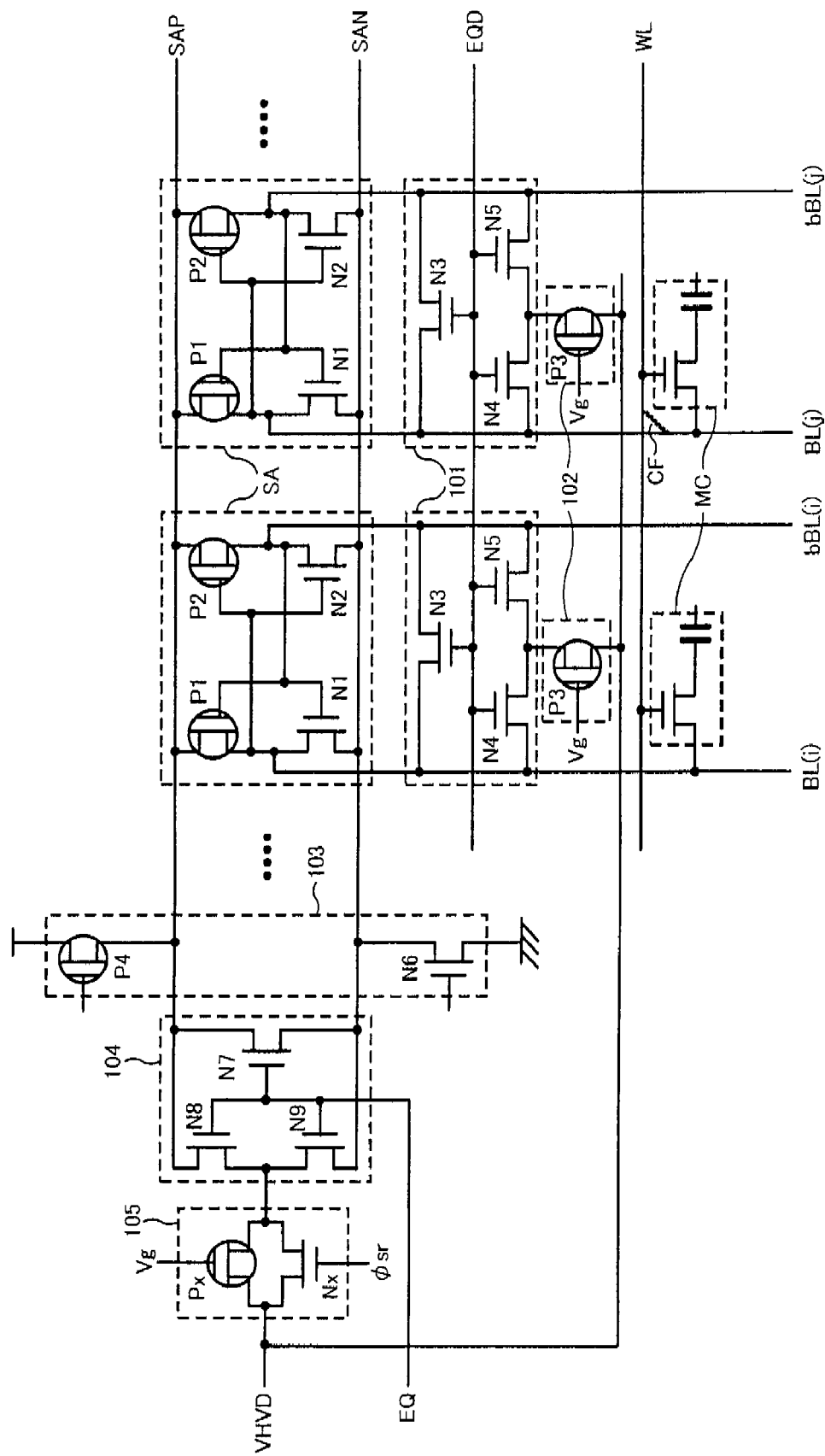
FIG. 2 is a diagram showing an essential configuration of the memory cell array 10 of FIG. 1 and its peripheral area.

Next, FIG. 2 is a diagram showing an essential configuration of the memory cell array 10 of FIG. 1 and its peripheral area, and a circuit portion including one word line WL, two bit line pairs BL and bBL. Regarding one bit line pair BL(i) and bBL(i) where a cross failure does not exist and the other bit line pair BL(i) and bBL(i) where a cross failure CF exists, FIG. 2 shows memory cells MC, sense amplifiers SA, bit line equalize circuits 101, current limiters 102, a sense amplifier drive circuit 103, a power supply line equalize circuit 104 and a current control circuit 105 are respectively shown. Among these, the memory cells MC, the sense amplifiers SA, the bit line equalize circuits 101 and the current limiters 102 are repeatedly arranged repeatedly in the same circuit configuration for each bit line pair BL and bBL. Further, the sense amplifier drive circuit 103, the power supply line equalize circuit 104 and the current control circuit 105 are repeatedly arranged in the same circuit configuration for each block of the memory cell array 10.

In the above-described configuration, the sense amplifier SA includes two PMOS transistors P1 and P2 and two NMOS transistors N1 and N2. A pair of the PMOS transistor P1 and the NMOS transistor P2 has commonly connected drains to which the bit line BL is connected and commonly connected gates to which the bit line bBL is connected. Meanwhile, a pair of the PMOS transistor P2 and the NMOS transistor N2 has commonly connected drains to which the bit line bBL is connected and commonly connected gates to which the bit line BL is connected. When the word line is driven to a selection level, a minute potential accumulated in a capacitor element of the memory cell MC is amplified by the sense amplifier SA via the bit line pair BL and bBL.

The bit line equalize circuit 101 includes three NMOS transistors N3, N4 and N5. One NMOS transistor N3 is connected between the bit line BL and the bit line bBL, and series connected two NMOS transistors N4 and N5 are connected therebetween. Three NMOS transistors N3, N4 and N5 has commonly connected gates to which the equalize control line EQD is connected. When the equalize control line EQD is controlled to be high, three NMOS transistors N3, N4 and N5 turn on and the bit line pair BL and bBL is set to an identical predetermined pre-charge voltage (e.g., VCC/2).

The current limiter 102 includes one PMOS transistor P3 connected between an intermediate node (source) of the NMOS transistors N4 and N5 of the bit line equalize circuit 101 and the pre-charge power supply line VHVD. The current limiter 102 functions to limit the current flowing from the pre-charge power supply line VHVD to the bit line equalize circuit 101 in response to a gate voltage Vg applied to the gate of the PMOS transistor P3.

A power supply line pair SAP and SAN is provided for supplying power to a plurality of the sense amplifiers SA. One power supply line SAP is connected to the sources of the two PMOS transistors P1 and P2 of the sense amplifier SA, and the other power supply line SAN is connected to the sources of the NMOS transistors N1 and N2 of the sense amplifier SA. The sense amplifier driving circuit 103 is a circuit for driving the sense amplifier SA via the power supply line pair SAP and SAN, and includes a PMOS transistor P4 connected between a power source and one power supply line SAP, and a MOS transistor N6 connected between ground and the other power supply line SAN.

The power supply line equalize circuit 104 includes three NMOS transistors N7, N8 and N9. One NMOS transistor N7 is connected between the power supply line SAP and the power supply line SAN, and series connected two NMOS transistors N8 and N9 are also connected therebetween. An equalize control line EQ is connected to the commonly connected gates of the three NMOS transistors N7, N8 and N9. When the equalize control line EQ is controlled to be high at a predetermined timing, the three NMOS transistors N7, N8 and N9 turn on and the power supply line pair SAP and SAN is set to the same predetermined pre-charge voltage (for example, VCC/2).

The current control circuit 105 is inserted in series between an intermediate node (source) of NMOS transistors N8 and N9 of the power supply line equalize circuit 104 and the pre-charge power supply line VHVD, and includes a PMOS transistor Px and an NMOS transistor Nx connected in parallel. The PMOS transistor Px functioning as the current limit circuit of the invention is provided for limiting current in response to the gate voltage Vg applied to its gate. Further, the NMOS transistor Nx functioning as the switch means of the invention is controlled based on a control signal φsr applied to its gate. Here, a current value limited by the PMOS transistor Px is set to, for example, about 1 μA. Actually, the above-mentioned limited current value is desired to be as small as possible for a circuit connected to the power supply line pair SAP and SAN.

In the first embodiment, it is a feature that the current supplied from the pre-charge power supply line VHVD to the power supply line pair SAP and SAN through the power supply line equalize circuit 104 is controlled by the current control circuit 105 at a predetermined timing. When the control signal φsr is controlled to be high, the NMOS transistor Nx turns on and sufficient current flows from the pre-charge power supply line VHVD to the power supply line equalize circuit 104. On the other hand, when the control signal φsr is controlled to be low in a state in which the predetermined gate voltage Vg is applied thereto, the current flowing from the pre-charge power supply line VHVD through the power supply line equalize circuit 104 is limited to, for example, about 1 μA. Thus, by controlling the control signal φsr to be low, it is possible to prevent current during self refresh from increasing due to the cross failure CF.

Figure 3:
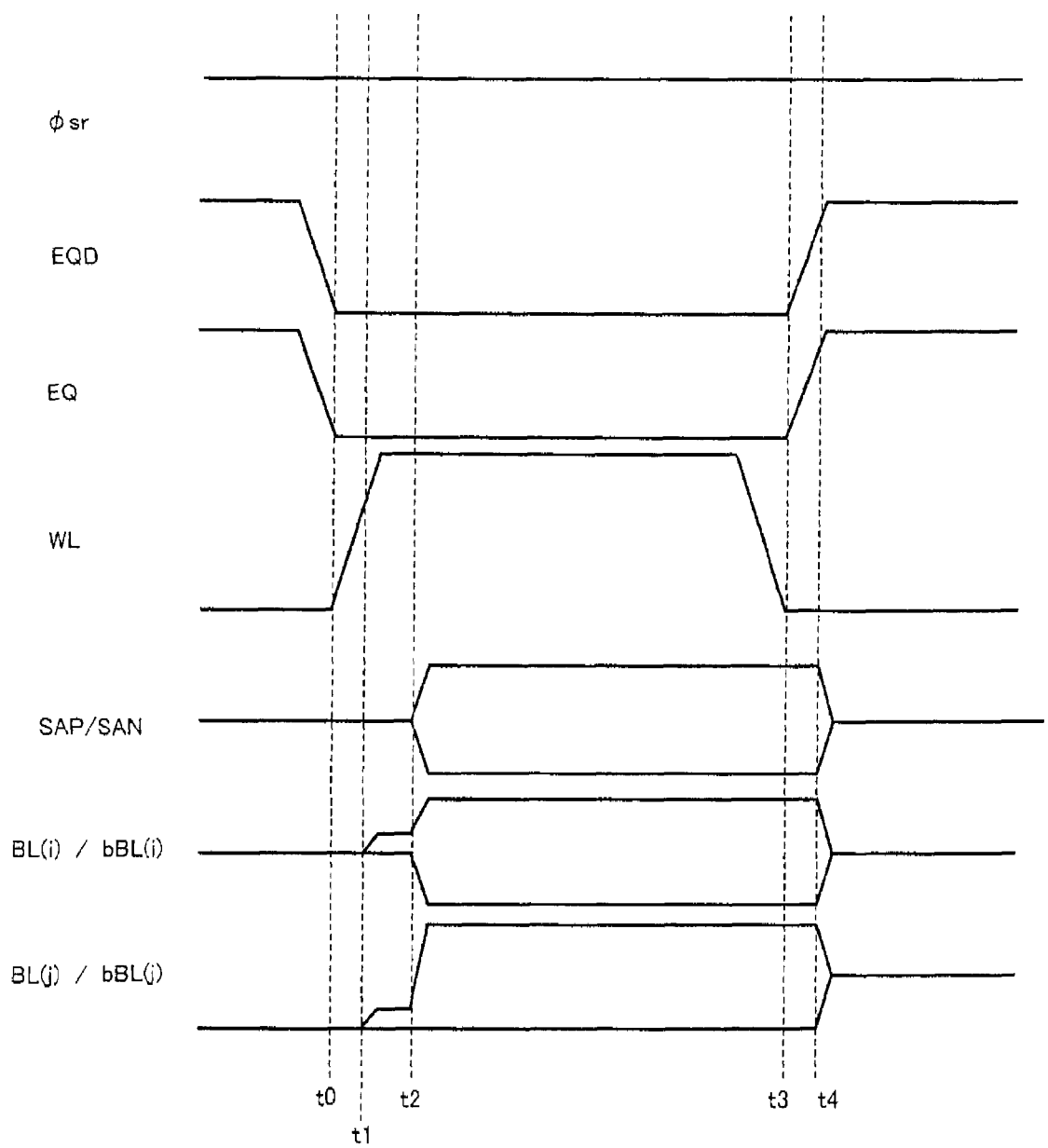
FIG. 3 is a timing chart for explaining operation in a normal operation period of the DRAM of the first embodiment.
Figure 4:
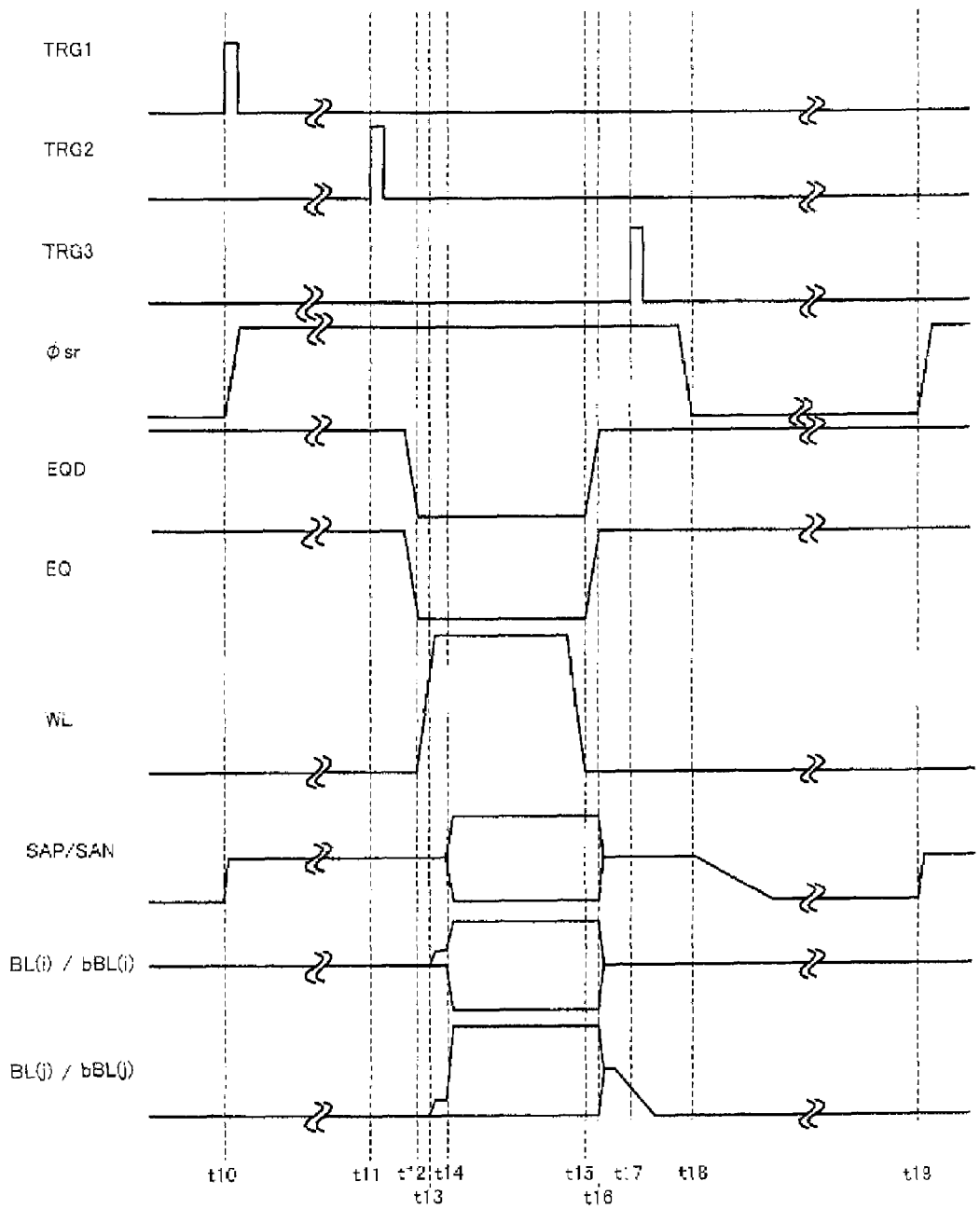
FIG. 4 is a timing chart for explaining operation in a self refresh operation period of the DRAM of the first embodiment.

Operation of the DRAM of the first embodiment will be described with reference to FIGS. 3 and 4. Regarding the DRAM having the circuit configuration of FIG. 2, a timing chart for explaining operation in a normal operation period is shown in FIG. 3, and a timing chart for explaining operation in a self refresh period is shown in FIG. 4. First, as shown in FIG. 3, the control signal φsr is always maintained high in the normal operation period of the DRAM. A word line WL to be accessed rises to high to be activated at a timing t0 and falls to low at a timing t3 after the access. The period during the word line WL is maintained high is controlled so that the equalize control line EQ for the bit line pair BL and bBL and the equalize control line EQD for the power supply line pair SAP and SAN are maintained low.

At the timing t0, the bit line pair BL(i) and bBL(i) where the cross failure CF does not exist is maintained at the predetermined pre-charge voltage at the timing t0. And at a timing t1 at which the word line WL changes to a selection level, a minute potential corresponding to the accumulated charge in the memory cell MC appears on the bit line pair BL(i) and bBL(i). On the contrary, the bit line pair BL(j) and bBL(j) where the cross failure CF exits falls to a lower level at the timing t0 due to current leak. In this sate, the minute potential corresponding to the accumulated charge in the memory cell MC appears on the bit line pair BL(j) and bBL(j) at the timing t1.

At a timing t2 at which the power supply line pair SAP and SAN is activated, the sense amplifier SA is driven and the minute potential is amplified via the bit line pair BL and bBL to generate a large potential regardless whether the cross failure CF exist. At this point, the bit line pair BL(j) and bBL(j) has been replaced with a redundancy circuit and thus operation of the DRAM is not prevented. At a timing t4 at which the equalize control lines EQ and EQD change to high, the power supply line pair SAP and SAN is pre-charged by the power supply line equalize circuit 104, and the bit line pair BL and bBL is pre-charged by the bit line equalize circuit 101. Thereafter, the bit line pair BL(i) and bBL(i) where the cross failure CF does not exist is maintained at the predetermined pre-charge voltage, while the bit line pair BL(j) and bBL(j) where the cross failure CF exists falls to a lower level by current leak and thereafter returns to the original state (state at the timing t0).

Although self refresh operation is repeated at a constant interval in the self refresh period of the DRAM, FIG. 4 shows a change in waveforms within a predetermined time range including one self refresh operation immediately before the exit of the self refresh period. In order to control the timings of the self refresh operation of the DRAM, three trigger signals TRG1, TRG2 and TRG3 shown in FIG. 4 are used. The trigger signal TRG1 is a signal for starting the pre-charge of the power supply line pair SAP and SAN before the self refresh operation. The trigger signal TRG2 is a signal for starting the self refresh operation. The trigger signal TRG3 is a signal for finishing the pre-charge after the power supply line pair SAP and SAN is self refreshed. These trigger signals TRG1, TRG2 and TRG3 are generated by the control logic unit 22 using the internal clock.

As shown in FIG. 4, the control signal φsr changes from low to high simultaneously when a pulse of the trigger signal TRG1 is output at a timing t10. At this point, the NMOS transistor Nx is turned on by the control signal φsr being high, and current is supplied from the pre-charge power supply line VHVD to the power supply line pair SAP and SAN through the NMOS transistor Nx and the power supply line equalize circuit 104. Thus the power supply line pair SAP and SAN which has been maintained low due to current leak of the cross failure CF is started to be charged, thereby being pre-charged to the predetermined pre-charge voltage.

At a timing t11, a pulse of the trigger signal TRG2 is output and the self refresh operation is started. First, the equalize control lines EQ and EQD fall to low at a timing t12. At this timing, the bit line pair BL(i) and bBL(i) where the cross failure CF does not exist is maintained at the predetermined pre-charge voltage, while the bit line pair BL(j) and bBL(j) where the cross failure CF exists falls to a lower level due to current leak. In this state, the word line WL is driven to the selection level, and therefore data corresponding to the accumulated charge in the memory cell MC is output to the bit line pair BL(i) and bBL(i) and the bit line pair BL(j) and bBL(j) respectively at a timing t13

Meanwhile, the NMOS transistors N7, N8 AND N9 of the power supply line equalize circuit 104 change to non-conductive states, and power supplying to the power supply line pair SAP and SAN is started by the sense amplifier driving circuit 103 at the timing t12. Therefore, at a timing t14, the power supply line SAP changes to high, and the power supply line SAN changes to low. During the self refresh period, the sense amplifier driving circuit 103 is controlled to operate in connection with the self refresh operation. Further, at the same timing t14, large potential differences which are amplified by the sense amplifiers SA are obtained on the bit line pair BL(i) and bBL(i) and the bit line pair BL(j) and bBL(j).

Then after the word line is maintained at the selection level for a predetermined time period, it falls to a non-selection level to be reset at a timing t15. Subsequently, the power supply line pair SAP and SAN and the bit line pair BL and bBL are pre-charged again simultaneously when the equalize control lines EQ and EQD change to high at a timing t16. Thereby, the bit line pair BL(i) and bBL(i) where the cross failure CF does not exist is maintained at the predetermined pre-charge voltage, the bit line pair BL(i) and bBL(i) where the cross failure CF exists decreases to near a lower level due to current leak. Time required for the level to fall at this point depends on a setting of the current limiter 102, which may take a short time of approximately about several ns.

Figure 12:
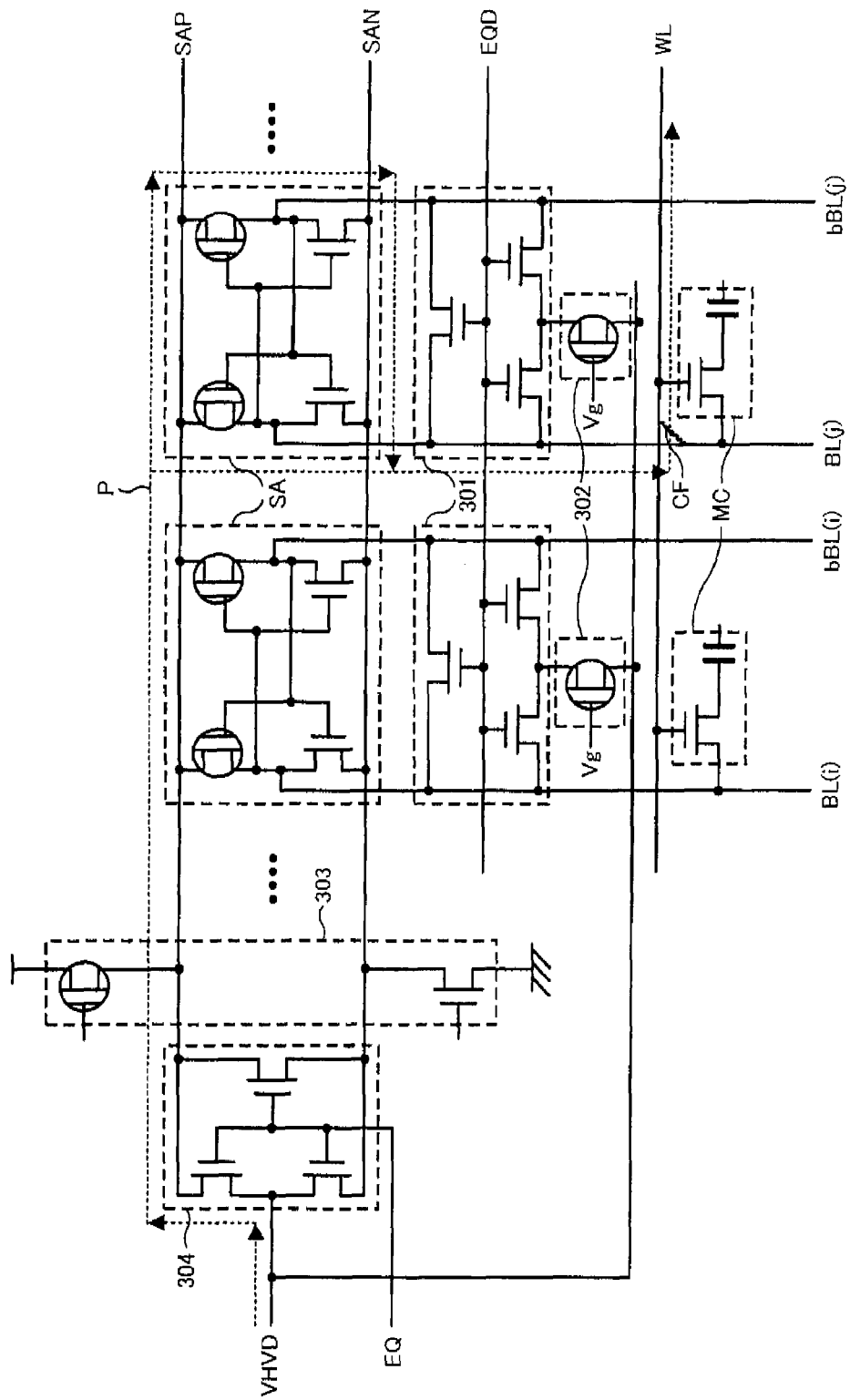
FIG. 12 is an example of a configuration of a conventional DRAM including a current limiter.
Figure 13:
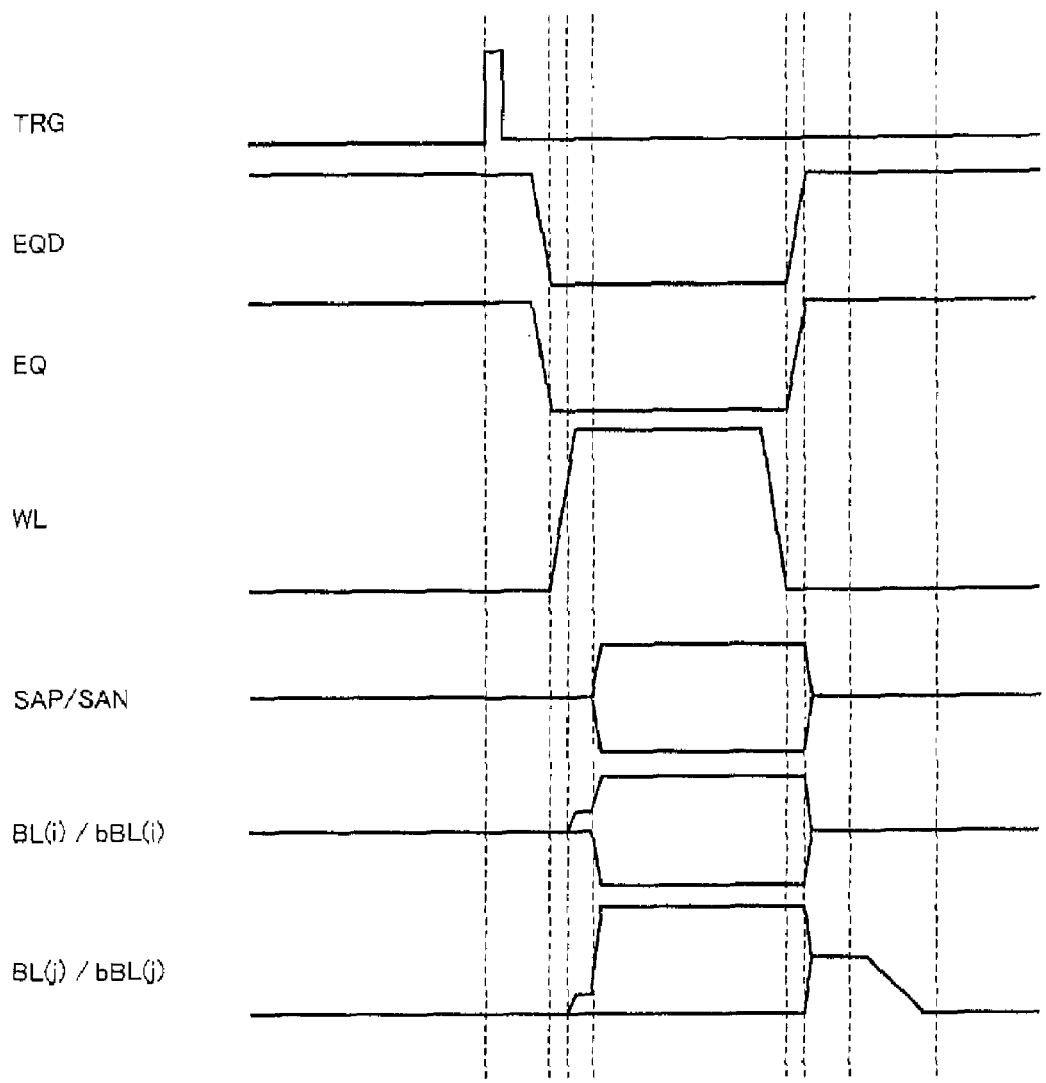
FIG. 13 is a timing chart for explaining operation of the DRAM of FIG. 12 in the self refresh period.

After a pulse of the trigger signal TRG3 is output at a timing t17, the control signal φsr changes from high to low at a timing t18. Thereby, the NMOS transistor Nx of the current control circuit 105 changes to a non-conductive state, and current flowing from the pre-charge power supply line VHVD to the power supply line pair SAP and SAN is limited by the PMOS transistor Px. At this point, levels of the bit line pair BL(j) and bBL(j) have been lower due to the existence of the cross failure CF. Accordingly, the power supply line pair SAP and SAN is gradually discharged through the current leak path P (see FIG. 12) leading to the cross failure CF, and its level gradually decreases while keeping the same potential as each other. The current value at this point depends on a capacitance component and a resistance component in the current path in addition to characteristics of the PMOS transistor Px, and can be limited within about 1 μA.

Finally, an EXIT command for exiting from the self refresh period to shift to the normal operation is input at a timing t19. When the EXIT command is decoded by the command decoder 21, the control signal φsr goes high. Thereby, the power supply line pair SAP and SAN is pre-charged, and thereafter operations corresponding to various commands can be performed. In addition, when the EXIT command is not input, the same operation as the timing chart during the self refresh period of FIG. 4 is repeated.

As described above, by employing the configuration and control of the first embodiment, effects of suppressing an increase in current due to the cross failure CF in the self refresh period and improvement in manufacturing yield can be obtained. In other words, the self refresh operation is repeated in the self refresh period at the predetermined interval, and a time during the control signal φsr is high can be shorten as shown in FIG. 4, and during the other times the control signal φsr is low to maintain a state in which current limitation by the PMOS transistor Px can operate. Accordingly, the average current in the self refresh period can be limited to an extremely small value. Further, since an additional circuit of the first embodiment includes only two MOS transistors of the current control circuit 105, the above-mentioned effects can be achieved with a simple circuit configuration.

A specific effect is that the current due to the cross failure CF, which is assumed to be about 100 μA, can be reduced to about 5 μA in the first embodiment. In addition, when assuming that the refresh operation is performed at an interval of 40 μs in the self refresh period and one time refresh operation takes 100 ns, since time periods during the current limitation by the PMOS transistor Px does not operate are no more than 0.25% in the whole time and thus a larger effect of decreasing consumption current is obtained.

Second Embodiment

A semiconductor memory device of a second embodiment will be described. The entire configuration of a DRAM as a semiconductor memory device of the second embodiment is the same as in FIG. 1, so description thereof will be omitted. In the second embodiment, a circuit confirmation and timing charts are different from those of the first embodiment, which will be described in the following.

Figure 5:
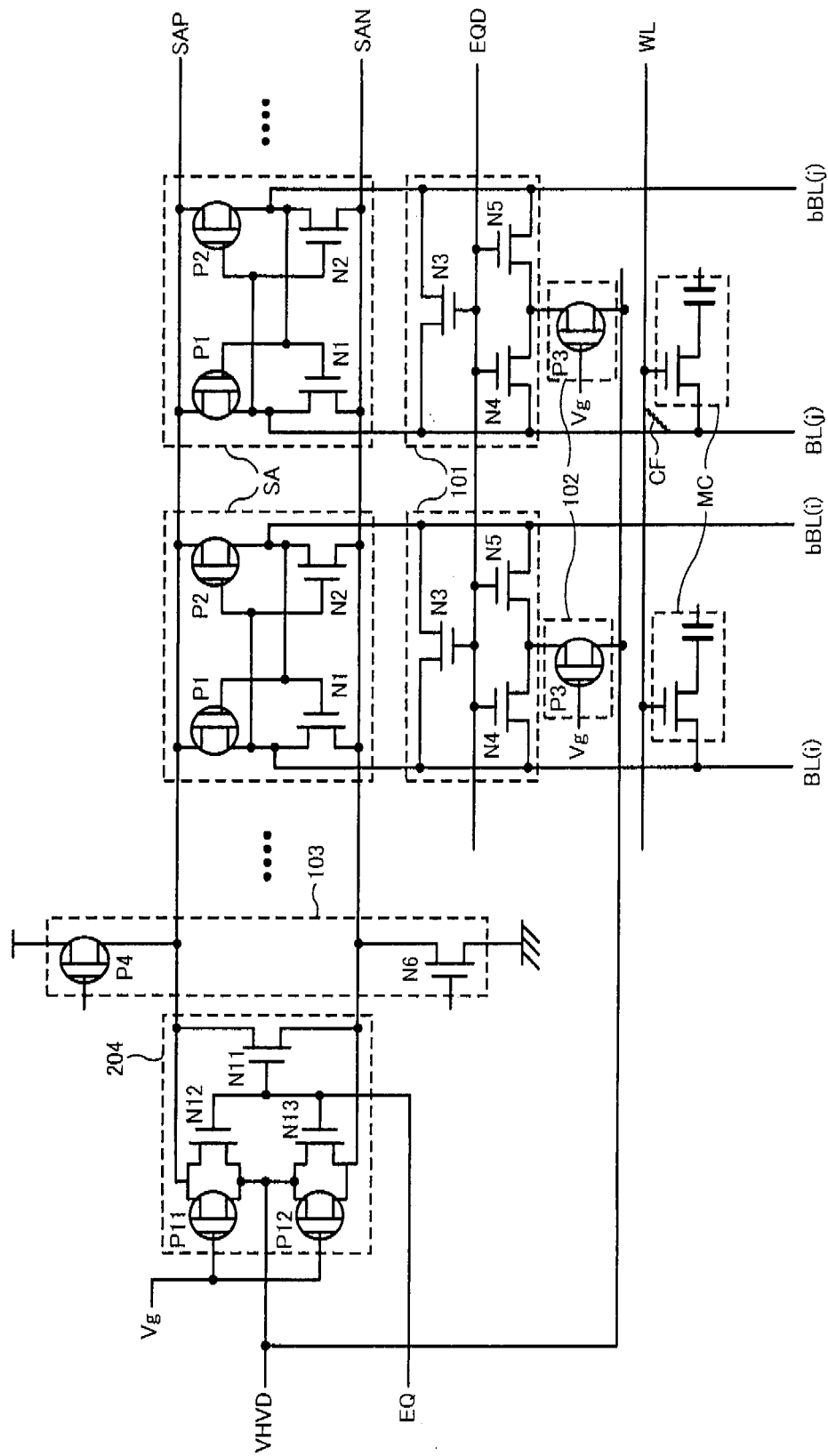
FIG. 5 is a diagram showing an essential configuration of the memory cell array 10 and its peripheral area in the DRAM of the second embodiment.

FIG. 5 shows a diagram showing an essential configuration of the memory cell array 10 and its peripheral area in the DRAM of the second embodiment. In FIG. 5, the memory cells MC, the sense amplifiers SA, the word line WL, the bit line pairs BL and bBL, the bit line equalize circuits 101, the current limiters 102 and the sense amplifier driving circuit 103 are the same as those in FIG. 2 of the first embodiment. Further, regarding the existence of the cross failure CF, a relation between the bit line pair BL(i) and bBL(i) and the bit line pair BL(j) and bBL(j) is also the same as that in FIG. 2.

Meanwhile, in the second embodiment, the power supply line equalize circuit 104 and the current control circuit 105 in FIG. 2 are combined and thereby configuring the power supply line equalize circuit 204. The power supply line equalize circuit 204 includes two PMOS transistors P11 and P12 functioning as the current limit circuit of the invention in addition to the three NMOS transistors N11, N12 and N13. The NMOS transistor N12 and the PMOS transistor P11 are connected in parallel, and the NMOS transistor N13 and the PMOS transistor P12 are connected in parallel.

Connection relation of the three NMOS transistors N11, N12 and N13 is the same as that of FIG. 2, and the equalize control line EQ is connected to commonly connected gates thereof. Current flowing through the PMOS transistors P11 and P12 in response to the gate voltage Vg applied to commonly connected gate thereof is limited. Accordingly, in a state in which the equalize control line EQ is low, current of which the maximum value is the limited current value is flowing from the pre-charge power supply line VHVD to the power supply line pair SAP and SAN through the PMOS transistors P11 and P12. This limited current value is limited to, for example, about 1 μA by a setting of the gate voltage Vg. On the other hand, in a state in which the equalize control line EQ is high, current limitation by the PMOS transistors P11 and P12 does not operate, and it is possible to flow sufficient current through the NMOS transistors N12 and N13.

Figure 6:
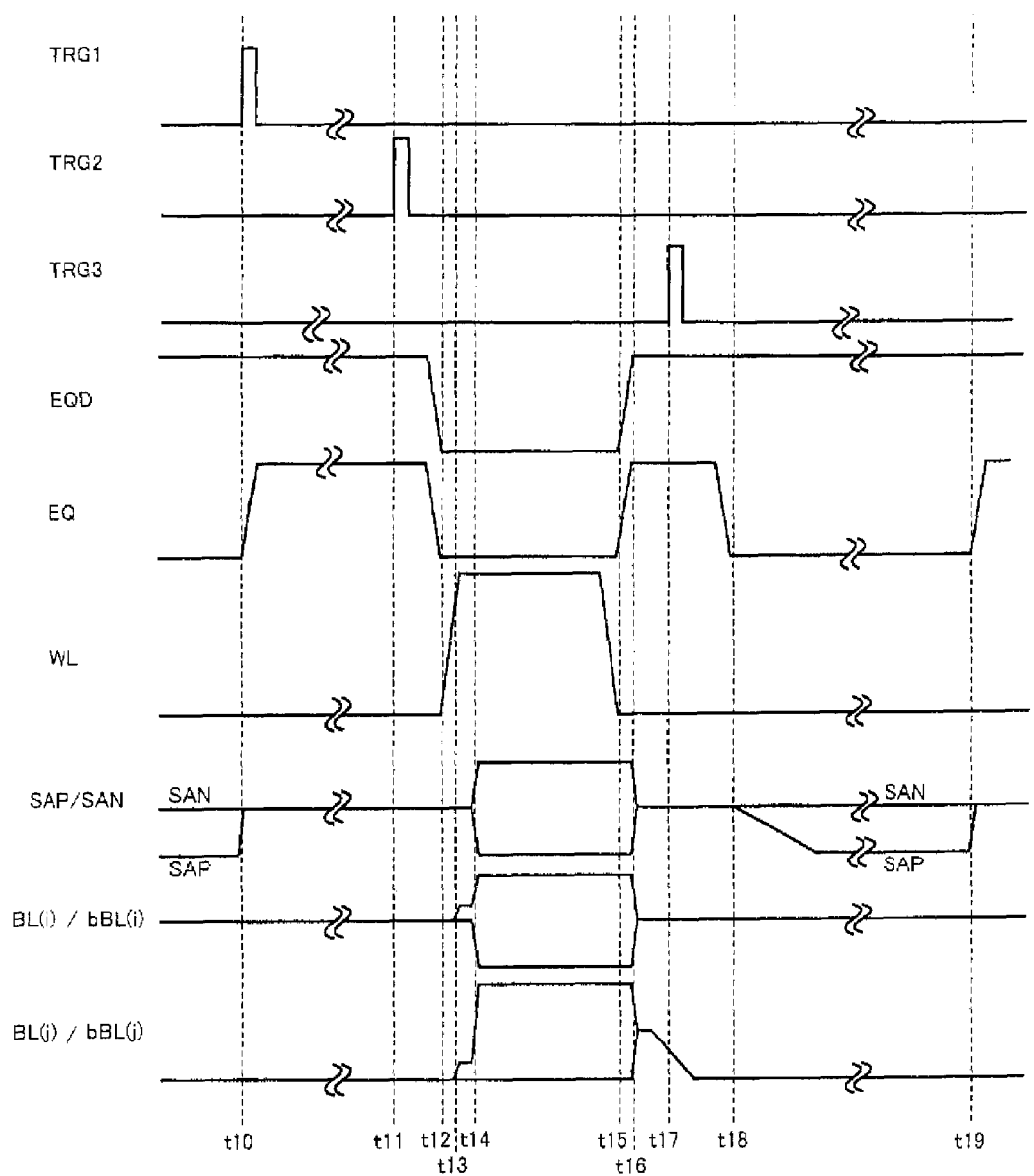
FIG. 6 is a timing chart for explaining operation in the self refresh operation period of the DRAM of the second embodiment.

Operation of the DRAM of the second embodiment will be described with reference to a timing chart of FIG. 6. In the normal operation period, the DRAM of the second embodiment operates in the same manner as FIG. 3 of the first embodiment, so description thereof will be omitted. Meanwhile, in the self refresh period of the DRAM of the second embodiment, the timing chart of FIG. 6 shows a change in waveforms within a time range similarly as in FIG. 4. The three trigger signals TRG1, TRG2 and TRG3 shown in FIG. 6 are controlled at the same timings as in FIG. 4, and the timings t10 to t12 are shown as in FIG. 4.

In FIG. 6, waveforms of the equalize control line EQ and the power supply line pair SAP and SAN are different from those of FIG. 4, and the following description will be made while paying attention mainly to changes in these waveforms. The equalize control line EQ changes from low to high simultaneously when a pulse of the trigger signal TRG1 is output at the timing t10. Thereby, the pre-charge is started by the power supply line equalize circuit 204, and current is supplied from the pre-charge power supply line VHVD to the power supply line pair SAP and SAN through the NMOS transistors N12 and N13. Thus, the power supply line SAP which has been maintained low due to current leak of the cross failure CF is started to be charged, thereby being pre-charged to the predetermined pre-charge voltage.

When a pulse of the trigger signal TRG2 is output and the self refresh operation is started at the timing t11, the equalize control line EQ changes from high to low at the timing t12. The subsequent self refresh operation is performed in the same manner as FIG. 4 of the first embodiment, the equalize control line EQ changes from low to high at the timing t16 after the self refresh operation is finished. Thereby, the pre-charge after self refresh is started by the power supply line equalize circuit 204, and current is supplied from the pre-charge power supply line VHVD to the power supply line pair SAP and SAN through the NMOS transistors N12 and N13. Thus, the power supply line pair SAP and SAN is pre-charged to the predetermined pre-charge voltage.

After a pulse of the trigger signal TRG3 is output at the timing t17, the pre-charge control line EQ changes from high to low at the timing t18. Thereby, NMOS transistors N11, N12 and N13 of the power supply line equalize circuit 204 change to non-conductive states, and current flowing from the pre-charge power supply line VHVD to the power supply line pair SAP and SAN is limited by the PMOS transistors P11 and P12. Thereafter, the same state is maintained until the timing t19, and when the EXIT command is input at the timing t19, the same operation as in FIG. 4 is performed.

On the other hand, as shown in FIG. 6, a change in waveforms of the power supply line pair SAP and SAN after the timing t17 is different from that in FIG. 4. That is, the level of the power supply line SAN is maintained after the timing t17, while the level of the power supply line SAP gradually decreases to near the ground level. In this time period, since the equalize control line EQ is high in FIG. 4, the power supply line pair SAP and SAN is balanced at the same potential. However, since the equalize control line EQ is low in FIG. 6, the power supply line pair SAP and SAN is in an unbalance state and each potential can be changed. Accordingly, only the power supply line SAP is discharged through the PMOS transistors P11 and P12 along the current leak path P (see FIG. 12), the power supply line SAP corresponds to the waveform in FIG. 6.

Figure 7:
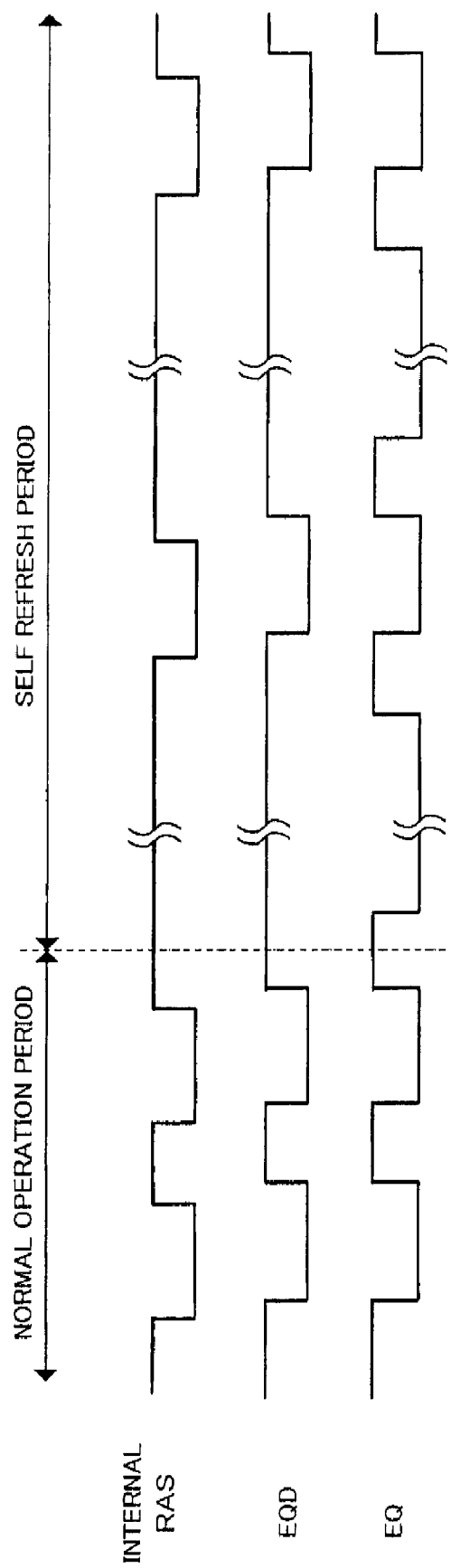
FIG. 7 is a change in waveforms over a longer time range in the DRAM of the second embodiment.

Here, FIG. 7 shows a change in waveforms over a longer time range corresponding to the timing chart of FIG. 6. In FIG. 7, in the time range including the normal operation period and the self refresh period of the DRAM, changes of waveforms of an internal RAS signal and the equalize control lines EQ and EQD are compared. A time range in which refresh is performed corresponds to a period during which the internal RAS signal is low, refresh is relatively frequently performed in the normal operation period, and an refresh interval is prolonged in the self refresh period. In the normal operation period, the equalize control lines EQ and EQD follow the change of the internal RAS signal, while in the self refresh period, only the equalize control line EQ changes in a different manner based on the timing chart of FIG. 6. As described above, a time range in which self refresh is not performed occupies most of the self refresh period, and in this time range the equalize control line EQ continues to be low so that the current limit circuit operates. Thereby, it is understood that the unbalance state of the power supply line pair SAP and SAN is acceptable.

As described above, by employing the configuration and control of the second embodiment, in addition to the effects of suppressing an increase in current due to the cross failure CF in the self refresh period and improvement in manufacturing yield, the other effect of preventing a local decrease in level from affecting the other circuits so as to suppress undesired level decrease by setting the power supply line pair SAP and SAN in an unbalance state. Further, in the second embodiment, an average current in the self refresh period can be sufficiently reduced as in the first embodiment. Moreover, an additional circuit of the second embodiment includes only two PMOS transistors P11 and P12 of the power supply line equalize circuit 204, and thus the above described effects can be achieved with a relatively simple circuit configuration.

Third Embodiment

A semiconductor memory device of a third embodiment will be described. The entire configuration of a DRAM as a semiconductor memory device of the third embodiment is the same as in FIG. 1, and description thereof will be omitted. In the third embodiment, a circuit configuration and timing charts are different from those of the first and second embodiments, which will be described in the following.

Figure 8:
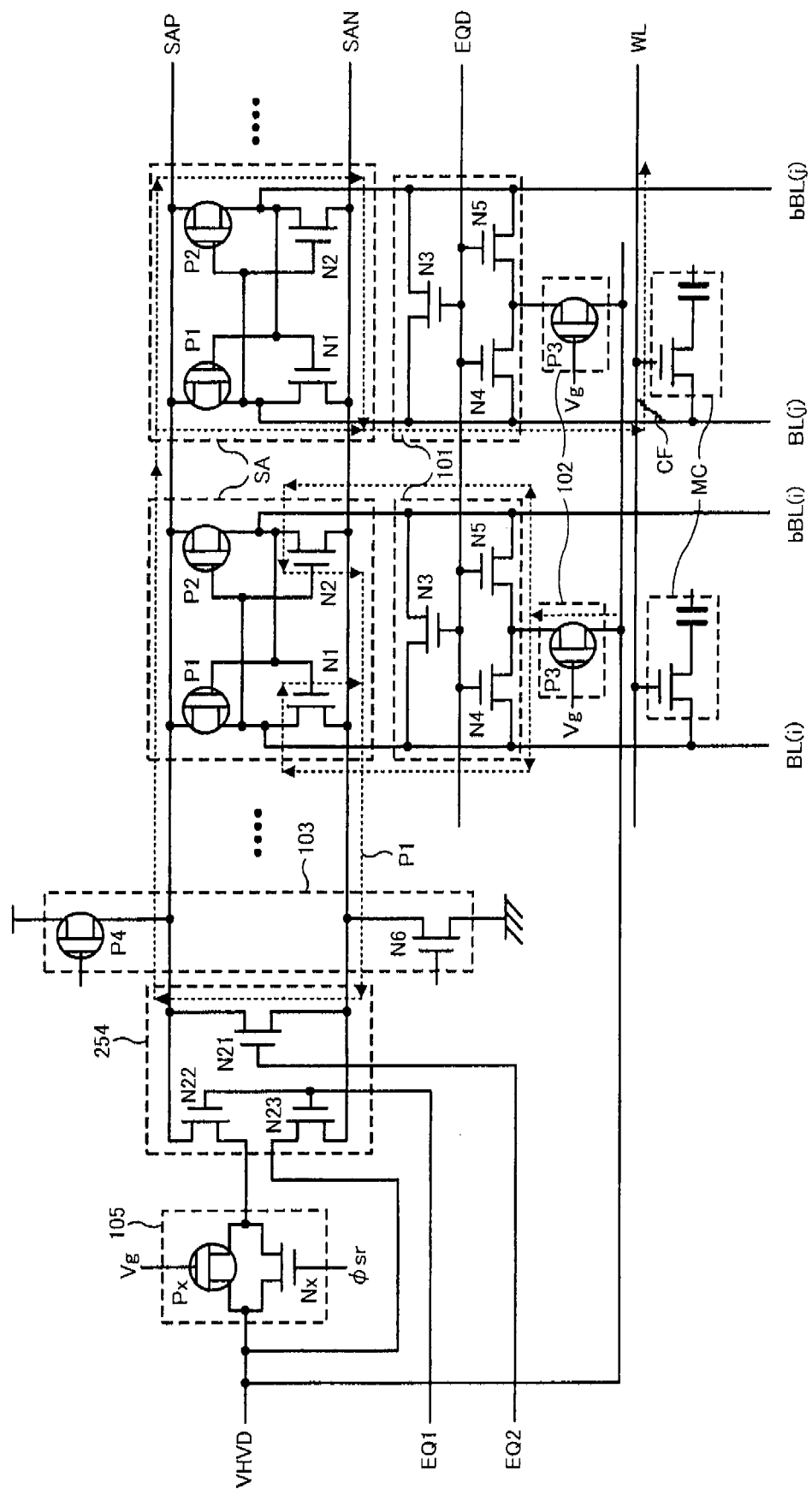
FIG. 8 is a diagram showing an essential configuration of the memory cell array 10 and its peripheral area in the DRAM of the third embodiment.

FIG. 8 shows a diagram showing an essential configuration of the memory cell array 10 and its peripheral area in the DRAM of the third embodiment. In FIG. 8, the memory cells MC, the sense amplifiers SA, the word line WL, the bit line pairs BL and bBL, the bit line equalize circuits 101, the current limiters 102 and the sense amplifier driving circuit 103 are the same as those in the first and second embodiments (FIGS. 2 and 5), and the current control circuit 105 is configured in the same manner as in the first embodiment (FIG. 2). Further, regarding the existence of the cross failure CF, a relation between the bit line pair BL(i) and bBL(i) and the bit line pair BL(j) and bBL(j) is also the same as that in FIG. 2 or 5.

Meanwhile, in the third embodiment, connection relation of the power supply line equalize circuit 254 is different from that of the power supply line equalize circuit 104 of FIG. 2. The power supply line equalize circuit 254 of FIG. 8 includes three NMOS transistors N21, N22 and N23. Different from FIG. 2, the gate of the NMOS transistor N21 is disconnected from each gate of the NMOS transistors N22 and N23, a first equalize control line EQ1 is connected to each gate of the NMOS transistors N22 and N23, and a second equalize control line EQ2 is connected to the gate of the NMOS transistor N21.

Further, the NMOS transistor N21 is connected between the power supply line SAP and the power supply line SAN in the same manner as in FIG. 2, while two NMOS transistors N22 and N23 are not connected in series, which differs from FIG. 2. That is, the NMOS transistor N22 is connected between the power supply line SAP and the output side of the current control circuit 105, and the NMOS transistor N23 is connected between the input side of the current control circuit 105 and the power supply line SAN.

A feature of the third embodiment is that the NMOS transistors N22 and N23 which supply current from the pre-charge power supply line VHVD to the power supply line pair SAP and SAN and the NMOS transistor N21 which sets the power supply line SAP and the power supply line SAN at the same potential can be controlled individually. By such a configuration, current flowing through a current leak path P1 different from the current leak path P (see FIG. 12) can be limited.

The current leak path P1 is a path of leak current flowing to the word line WL along a dotted arrow in FIG. 8 regarding all the bit line pairs BL and bBL when a negative potential is supplied to the word line WL. Specifically, the leak current flows from the pre-charge power supply line VHVD along the current leak path P1 through in the order of the current limiter 102, the bit line equalize circuit 101, the bit line pair BL and bBL, a pair of the NMOS transistors N1 and N2 of the sense amplifier SA, the power supply line SAN, the power supply line equalize circuit 254, the power supply line SAP, a pair of the PMOS transistors P1 and P2 of the sense amplifier SA, the bit line pair BL(j) and bBL(j), the cross failure CF and the word line WL. The leak current flowing along the current leak path P1 is limited by the current limiter 102. However since currents flowing a large number of the bit lines BL and bBL meet at the power supply line SAN, magnitude of the total leak current is not negligible. In the third embodiment, the above described configuration of the power supply line equalize circuit 254 is employed to take measures against current leak flowing through the current leak path P1 in addition to the current leak path P.

Figure 9:
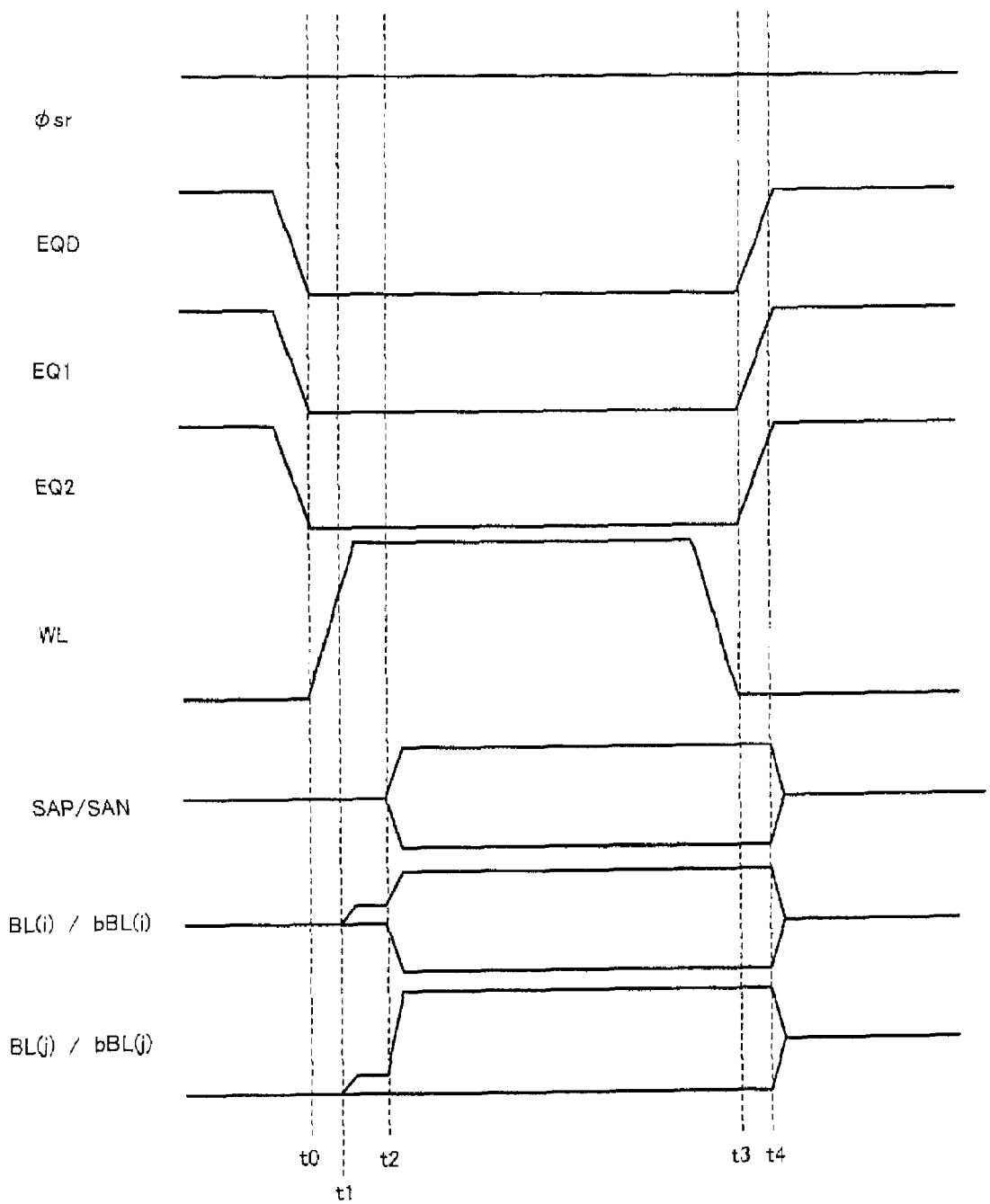
FIG. 9 is a timing chart for explaining operation in the normal operation period of the DRAM of the third embodiment.
Figure 10:
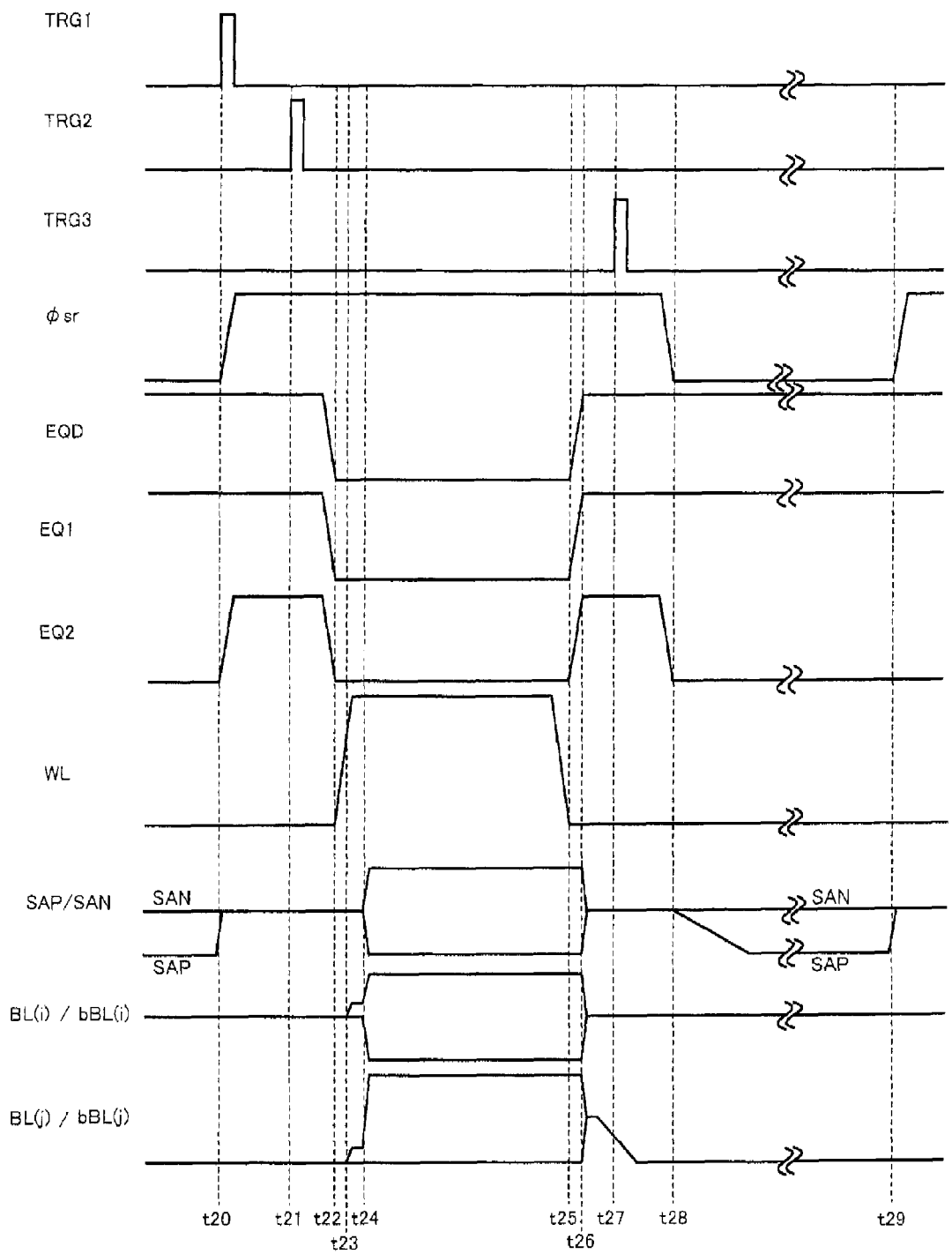
FIG. 10 is a timing chart for explaining operation in the self refresh operation period of the DRAM of the third embodiment.

Operation of the DRAM of the third embodiment will be described with reference to FIGS. 9 and 10. FIG. 9 is a timing chart explaining operation in the normal operation period, and FIG. 10 is a timing chart explaining operation in the self refresh period. As shown in FIG. 9, waveforms of the control signal φsr, the equalize control line EQD, the word line WL, the power supply line pair SAP and SAN, and the bit line pair BL and bBL are the same as those in FIG. 3 of the first embodiment. Further, waveforms of the first equalize control line EQ1 and the second equalize control line EQ2 are both the same as the waveform of the equalize control line EQ in FIG. 3. That is, before the timing t0 and after the timing t4, the power supply line pair SAP and SAN is commonly set at the pre-charge voltage by the power supply line equalize circuit 254. On the other hand, between the timings t0 to t4, the NMOS transistors N21, N22 and N23 are controlled to be off in order to read the memory cell MC.

Next, in the self refresh period of the DRAM of the third embodiment, a change in waveforms are shown in the timing chart of FIG. 10 within the same time range as FIG. 4. The three signals TRG1, TRG2 and TRG3 of waveforms shown in FIG. 10 have the same functions as those in FIG. 4, but application timings thereof are slightly different. Further in FIG. 10, timings t20 to t29 corresponding to the timings t10 to t19 in FIG. 4 are shown. In the following description, points in the waveforms of FIG. 10 which are different from FIG. 4 will be mainly described.

As shown in FIG. 10, before the timing t20, the control signal φsr is low, the first equalize control line EQ1 is high and the second equalize control line EQ2 is low. Thus, the NMOS transistor Nx of the current control circuit 105 is controlled to be off, the NMOS transistors N22 and N23 of the power supply line equalize circuit 254 are controlled to be on, and the NMOS transistors N21 is controlled to be off. In other words, since the power supply line SAP and the power supply line SAN are disconnected, and current flowing from the pre-charge power supply line VHVD to the power supply line SAP is limited by the PMOS transistor Px. Therefore, the current leak path P1 of FIG. 8 is blocked so that an influence of the current leak can be avoided. Since both the current leak paths P (FIG. 12) and P1 do not include a path going directly to the power supply line SAN from the pre-charge power supply line VHVD, it is not a problem that the current control circuit 105 is not inserted between the pre-charge power supply line VHVD and the power supply line SAN, as shown in FIG. 9.

The control signal φsr changes from low to high and the second equalize control line EQ2 changes from low to high simultaneously when a pulse of the trigger signal TRG1 is output at the timing t20. Thereby, the NMOS transistor Nx turns on, current flowing from the pre-charge power supply line VHVD to the power supply line SAP increases, the power supply line SAP and the power supply line SAN are connected to each other via the NMOS transistor N21 being controlled to be on. Immediately before the timing t20, the power supply line SAP has dropped to low due to current leak of the cross failure CF, and after the timing t20, potential of the power supply line SAP increases to the predetermined pre-charge voltage by the pre-charge via the pre-charge power supply line VHVD, so that the power supply line pair SAP and SAN is balanced at the same potential.

When a pulse of the trigger signal TRG2 is output at a timing t21 to start the self refresh operation, the first equalize control line EQ1 and the second equalize control line EQ2 change from high to low simultaneously at a timing t22. Thereby, the NMOS transistors N21, N22 and N23 go low, and thereafter the self refresh operation is performed in the same manner as in FIG. 4 of the first embodiment until a timing t26.

When one self refresh operation is finished, both the first equalize control line EQ1 and the second equalize control line EQ2 change from low to high so as to be in the same control state as in the above-mentioned timings t20 to t21. Thus, the power supply line pair SAP and SAN is pre-charged to the predetermined pre-charge voltage by the pre-charge power supply line VHVD, and the power supply line pair SAP and SAN is balanced at the same potential via the NMOS transistor N21.

After a pulse of the trigger signal TRG3 is output at a timing t27, the control signal φsr changes from high to low and the second equalize control line EQ2 changes from high to low at a timing t28. Thereby, the NMOS transistor Nx returns to a non-conductive state, and current flowing from the pre-charge power supply line VHVD to the power supply line SAP is limited. And the NMOS transistor N21 is controlled to be off so that the power supply line SAP and the power supply line SAN are in a disconnected state again.

Thereafter state are the same as before the timing t20, and the current leak path P1 of FIG. 8 is blocked. In this case, a change in the waveform of the power supply line pair SAP and SAN after the timing t28 is different from that in FIG. 4 of the first embodiment, but it is the same as that in FIG. 6 of the second embodiment. That is, the level of the power supply line SAN is maintained after the timing t27, while the level of the power supply line SAP gradually decreases to near the ground level. This is because the power supply line SAP is gradually discharged through the current leak path P (see FIG. 12) due to the existence of the cross failure CF.

In addition, when a new refresh operation is performed after the timing t28, processes of the timing t20 to t28 are repeated, and when the EXIT command is input at a timing t29, the same process as in FIG. 9 is performed.

Figure 11:
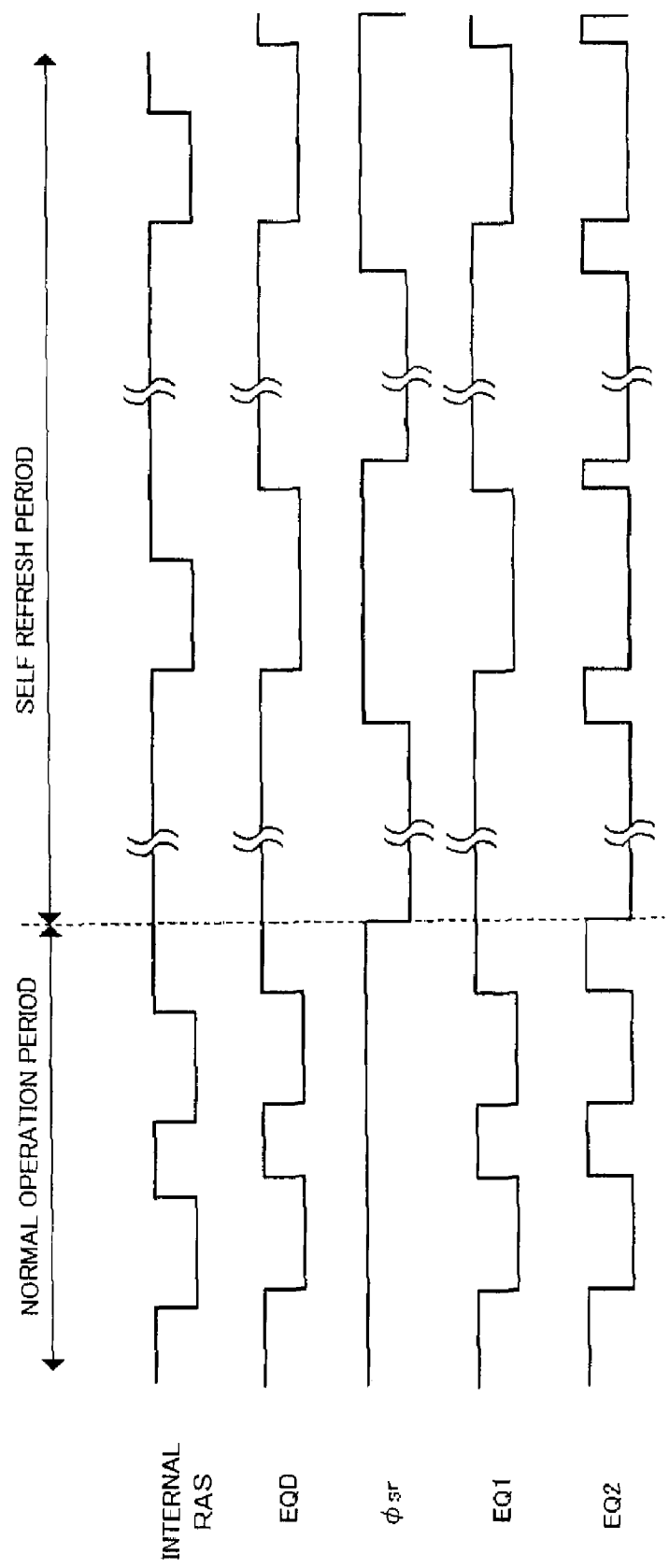
FIG. 11 is a change in waveforms over a longer time range in the DRAM of the third embodiment.

Here, FIG. 11 shows a change in waveforms over a longer time range corresponding to the timing chart of FIG. 10. In FIG. 11, in the same time range as in FIG. 7, changes of waveforms of the internal RAS signal, the equalize control line EQD, the control signal φsr, the first equalize control line EQ1 and the second equalize control line EQ2 are compared. In the normal operation period, the equalize control line EQD, the first equalize control line EQ1 and the second equalize control line EQ2 respectively follow the change of the internal RAS signal. Meanwhile, in the self refresh period, respective signals change based on the timing chart of FIG. 10. As described above, in the time range of most of the self refresh period, the second equalize control line EQ2 is maintained low, and in this time range, the above-mentioned current leak path P1 can be blocked.

Regarding the second equalize control line EQ2 in FIG. 10, if the time width in which the line goes high between the timings t20 and t22 is assumed to be T1 and the time width in which the line goes high again between the timings t26 and t28 is assumed to be T2, a lager effect of reducing the leak current can be obtained by reducing the time widths T1 and T2. However, due to an operational restriction of the power supply line equalize circuit 254 or obtaining the timing margin, the time widths need to be secured to some extent. For example, a setting of T1=10 ns and T2=5 ns can be selected.

As described above, by employing the configuration and control of the third embodiment, in the power supply line equalize circuit 254, control of the NMOS transistor N 21 and control of a pair of the NMOS transistors N22 and N23 can be performed individually. Accordingly, current flowing through the current leak path P1 in addition to the current leak path P due to the cross failure CF can be suppressed in the self refresh period, and the effect of further reducing current can be achieved with a relatively simple circuit configuration.

In the foregoing, the present invention is specifically described according to the three embodiments. However, the present invention is not limited to the first to third embodiments and can variously be modified without departing the essentials of the present invention. That is, the present invention is not limited to configurations of FIGS. 1, 2, 5 and 8, and can be applied to DRAMs having various configurations. Further, the present invention can be widely applied to not only a DRAM as a semiconductor memory device but also other semiconductor memory devices.

In addition, the present invention is not limited to specific configuration of the embodiments, and when applying the present invention, MOS transistors included in the power supply line equalize circuit, the current limit circuit and the switch means can be NMOS transistors or PMOS transistors, so that configuration using NMOS or PMOS transistors can be selectively employed in accordance with design conditions.

The present invention is not limited to the above described embodiments, and various variations and modifications may be possible without departing from the scope of the present invention.

This application is based on the Japanese Patent applications No. 2006-201354 filed on Jul. 24, 2006 and No. 2007-152166 filed on Jun. 7, 2007, entire content of which is expressly incorporated by reference herein.

What is claimed is:

1. A semiconductor memory device having a plurality of memory cells arranged at intersections of a plurality of bit lines and a plurality word lines, comprising:

a sense amplifier for amplifying a minute potential difference appearing on a bit line pair corresponding to an accumulated charge in said memory cell;

a power supply line pair including a first power supply line for supplying a first potential to said sense amplifier and a second power supply line for supplying a second potential to said sense amplifier;

a pre-charge power supply line for supplying a predetermined pre-charge potential;

a power supply line equalize circuit for setting said first potential and said second potential of said power supply line pair at the same potential based on said pre-charge potential;

a current limit circuit inserted in series in a predetermined current path from said pre-charge power supply line to said power supply line pair; and switch means capable of switching whether or not current flowing from said pre-charge power supply line to said power supply line pair is limited by said current limit circuit, based on a control signal.

2. The semiconductor memory device according to claim 1, wherein said sense amplifier includes a pair of PMOS transistors and a pair of NMOS transistors, said first power supply line supplies said first potential to said pair of PMOS transistors, and said second power supply line supplies said first potential to said pair of NMOS transistors.

3. The semiconductor memory device according to claim 1, wherein said power supply line equalize circuit includes a first MOS transistor connected between said pre-charge power supply line and said first power supply line, a second MOS transistor connected between said pre-charge power supply line and said second power supply line, and a third MOS transistor connected between said first power supply line and said second power supply line, and commonly connected gates of the MOS transistors are connected to an equalize control line.

4. The semiconductor memory device according to claim 3, wherein said first, second and third MOS transistors of said power supply line equalize circuit are NMOS transistors.

5. The semiconductor memory device according to claim 1, wherein said switch means is connected to said current limit circuit in parallel and includes a MOS transistor whose conductive state is controlled based on said control signal applied to a gate thereof.

6. The semiconductor memory device according to claim 5, wherein said MOS transistor of said switch means is a NMOS transistor.

7. The semiconductor memory device according to claim 1, wherein said current limit circuit is connected between said pre-charge power supply line and said power supply line equalize circuit in series and includes a MOS transistor for limiting current in response to a gate voltage.

8. The semiconductor memory device according to claim 7, wherein said MOS transistor of said current limit circuit is a PMOS transistor.

9. The semiconductor memory device according to claim 3, wherein said current limit circuit includes a third MOS transistor connected to said first MOS transistor in parallel and a fourth MOS transistor connected to said second MOS transistor in parallel, and limits current in response to respective gate voltages.

10. The semiconductor memory device according to claim 9, wherein said third and fourth MOS transistors of said current limit circuit are PMOS transistors.

11. The semiconductor memory device according to claim 9, wherein said power supply line equalize circuit also functions as said switch means by supplying said control signal to said equalize control line.

12. The semiconductor memory device according to claim 1, further comprising:
a bit line equalize circuit for setting said bit line pair at the same potential based on said pre-charge potential; and
a current limit circuit for bit line pair for limiting current flowing from said pre-charge power supply line to said bit line pair through said bit line equalize circuit.

13. The semiconductor memory device according to claim 1, wherein said power supply line equalize circuit includes a first MOS transistor connected between an output side of said current limit circuit and said first power supply line, a second MOS transistor connected between an input side of said current limit circuit and second power supply line and a third MOS transistor connected between said first power supply line and said second power supply line,
and wherein commonly connected gates of the first and second MOS transistors are connected to a first equalize control line, and a gate of the third MOS transistor is connected to a second equalize control line.

14. The semiconductor memory device according to claim 13, wherein said first, second and third MOS transistors of said power supply line equalize circuit are NMOS transistors.

15. A control method of the semiconductor memory device according to claim 1, comprising:
controlling said switch means in a self refresh period during which self refresh is performed at a predetermined interval so that current flowing from said pre-charge power supply line to said power supply line pair is not limited by said current limit circuit and pre-charging said power supply line pair using said power supply line equalize circuit;
performing self refresh for a selected word line using said sense amplifier after the pre-charge is finished; and
controlling said switch means after the self refresh is finished so that current flowing from said pre-charge power supply line to said power supply line pair is limited by said current limit circuit.

16. A control method of the semiconductor memory device according to any one of claims 5 to 8, comprising:
controlling the MOS transistor of said switch means to be on based on said control signal in a self refresh period during which self refresh is performed at a predetermined interval so that current flowing from said pre-charge power supply line to said power supply line pair is limited by said current limit circuit and pre-charging said power supply line pair using said power supply line equalize circuit;
performing self refresh for a selected word line using said sense amplifier after the pre-charge is finished; and
controlling the MOS transistor of said switch means to be off based on said control signal after the self refresh is finished so that current flowing from said pre-charge power supply line to said power supply line pair is limited by said current limit circuit.

17. A control method of the semiconductor memory device according to claim 11, comprising:
controlling said equalize control line to be switched from on to off in a self refresh period during which self refresh is performed at a predetermined interval and pre-charging said power supply line pair using said power supply line equalize circuit;
performing self refresh for a selected word line using said sense amplifier, in a state in which said equalize control line is switched from a non-conductive state to a conductive state at a timing when the pre-charge is finished;
pre-charging said power supply line using said power supply line equalize circuit by changing said equalize control line after the self refresh is finished; and
changing said equalize control line to an original state at a timing when the pre-charge is finished.

18. A control method of the semiconductor memory device according to claim 13 or 14, comprising:
controlling said switch means in a self refresh period during which self refresh is performed at a predetermined interval so that current flowing from said pre-charge power supply line to said first power supply line is not limited by said current limit circuit and pre-charging said power supply line pair using said first equalize control line while keeping said first and second power supply lines at the same potential by said second equalize control line;
stopping the pre-charge by said first equalize control line and performing self refresh for a selected word line using said sense amplifier, in a state in which said first and second power supply lines are disconnected;

pre-charging said power supply line pair using said first equalize control line after the self refresh is finished while keeping said first and second power supply lines at the same potential by said second equalize control line; and controlling said switch means so that current flowing from said pre-charge power supply line to said first power supply line is limited by said current limit circuit, and controlling said second equalize control line so that said first and second power supply lines are disconnected.

* * * * *

UNITED STATES PATENT AND TRADEMARK OFFICE
CERTIFICATE OF CORRECTION

PATENT NO. : 7,606,094 B2  Page 1 of 1
APPLICATION NO. : 11/781757
DATED : October 20, 2009
INVENTOR(S) : Masaki Seno et al.

It is certified that error appears in the above-identified patent and that said Letters Patent is hereby corrected as shown below:

Title Page;

(75), delete "Masski Seno", insert -- Masaki Seno --

Column 8, line 62, delete "to", insert -- t0 --

Signed and Sealed this

Fifteenth Day of June, 2010

David J. Kappos
*Director of the United States Patent and Trademark Office*